United States Patent
Fusegawa et al.

(10) Patent No.: US 7,179,330 B2
(45) Date of Patent: Feb. 20, 2007

(54) METHOD OF MANUFACTURING SILICON SINGLE CRYSTAL, SILICON SINGLE CRYSTAL AND SILICON WAFER

(75) Inventors: Izumi Fusegawa, Fukushima (JP);
Sadayuki Okuni, Fukushima (JP);
Nobuaki Mitamura, Fukushima (JP);
Tomohiko Ohta, Fukushima (JP);
Nobuo Katuoka, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 130 days.

(21) Appl. No.: 10/510,695

(22) PCT Filed: Apr. 23, 2003

(86) PCT No.: PCT/JP03/05167

§ 371 (c)(1),
(2), (4) Date: Oct. 8, 2004

(87) PCT Pub. No.: WO03/091483

PCT Pub. Date: Nov. 6, 2003

(65) Prior Publication Data

US 2005/0160966 A1    Jul. 28, 2005

(30) Foreign Application Priority Data

Apr. 24, 2002   (JP) ............... 2002-122250

(51) Int. Cl.
*C30B 15/00* (2006.01)

(52) U.S. Cl. ............... 117/13; 117/12; 117/37; 117/54; 117/208

(58) Field of Classification Search ............ 117/12, 117/13, 37, 54, 208
See application file for complete search history.

(56) References Cited

U.S. PATENT DOCUMENTS 5,487,355 A * 1/1996 Chiou et al. ............ 117/13
5,911,822 A   6/1999 Abe et al.

(Continued)

FOREIGN PATENT DOCUMENTS

CN       1193054 A      9/1998

(Continued)

OTHER PUBLICATIONS

*Nikkei Microdevices*; No. 188; Feb. 2001; pp. 64-69; Nikkei BP Inc.

*Primary Examiner*—Yogendra Gupta
*Assistant Examiner*—G. Nagesh Rao
(74) *Attorney, Agent, or Firm*—Oliff & Berridge, PLC

(57) ABSTRACT

The present invention is a method of manufacturing a silicon single crystal by Czochralski method without performing Dash Necking method, wherein a temperature variation at a surface of a silicon melt is kept at ±5° C. or less at least for a period from a point of bringing the tip end of a seed crystal into contact with the silicon melt to a point of shifting to pull the single crystal. Thereby, in a method of growing a silicon single crystal by Czochralski method without using Dash Necking method, a success ratio of growing a single crystal free from dislocation can be increased, at the same time a heavy silicon single crystal having a large diameter in which a diameter of a constant diameter portion is over 200 mm can be grown even in the case of growing a silicon single crystal having a crystal orientation of <110>.

4 Claims, 3 Drawing Sheets

U.S. PATENT DOCUMENTS

| | | |
|---|---|---|
| 5,911,823 A | 6/1999 | Sonoda et al. |
| 6,056,818 A * | 5/2000 | Iino .......................... 117/13 |
| 6,197,108 B1 | 3/2001 | Iino et al. |
| 6,506,251 B1 * | 1/2003 | Kitagawa et al. ............. 117/13 |
| 6,913,646 B2 * | 7/2005 | Sakurada et al. ............ 117/13 |
| 7,083,677 B2 * | 8/2006 | Watanabe ................... 117/13 |
| 2002/0000187 A1 * | 1/2002 | Iino .......................... 117/13 |
| 2005/0076826 A1 * | 4/2005 | Watanabe ................... 117/13 |

FOREIGN PATENT DOCUMENTS

| | | |
|---|---|---|
| JP | A-01-203287 | 8/1989 |
| JP | A-09-165298 | 6/1997 |
| JP | A-10-203898 | 8/1998 |
| JP | A-10-324594 | 12/1998 |

* cited by examiner

METHOD OF MANUFACTURING SILICON SINGLE CRYSTAL, SILICON SINGLE CRYSTAL AND SILICON WAFER

TECHNICAL FIELD

The present invention relates to a method of manufacturing a silicon single crystal using Czochralski method (hereinafter, occasionally referred to as "CZ method"), more particularly, a method of manufacturing a silicon single crystal grown by Chochralski method by use of a seed crystal having a tip end with a sharp-pointed shape or a truncation thereof without using Dash Necking method, and a silicon single crystal and a silicon wafer manufactured thereby.

BACKGROUND ART

A silicon wafer, which is obtained by processing a silicon single crystal grown by mainly CZ method into wafers, is used as a wafer for a substrate material on which a semiconductor device is formed. In growth of a silicon single crystal using CZ method, generally a seed crystal having a shape shown in FIG. 2(A) or 2(B) is gently brought into contact with a silicon melt heated to 1420° C. of a melting point or more, and then the seed crystal is gradually pulled upward from the melt when a temperature of the seed crystal becomes steady. Thereby, a silicon single crystal is grown below the seed crystal. At this time, because innumerable slip dislocations are generated in the seed crystal as a result of thermal shock arising when the seed crystal is brought into contact with the silicon melt of high temperature, a necking portion where a diameter of the crystal grown following the seed crystal is once gradually lessened to about 3–5 mm is formed as shown in FIG. 4 in order to eliminate the slip dislocations. When the slip dislocations can have been eliminated from the grown crystal, a diameter of the crystal is gently enlarged to a desired diameter (formation of an enlarging diameter portion), and then an approximately cylindrical silicon single crystal having a diameter required in a constant diameter portion thereof is pulled.

A method of eliminating slip dislocations generated when a seed crystal comes into contact with a silicon melt by lessening a diameter of the crystal to about 3–5 mm is called as Dash Necking method, which is a manufacturing method widely utilized when growing a silicon single crystal by CZ method.

On the other hand, in recent manufacture of a silicon single crystal, a type of production in which a constant diameter portion of the single crystal is lengthened as much as possible is adopted in order to improve a productivity of a silicon single crystal itself and a silicon wafer having a large diameter is required with the aim of obtaining a large semiconductor device and improving a yield. Therefore, a single crystal to be pulled is becoming larger in diameter and heavier in weight.

In cases that such a heavy silicon single crystal having a large diameter is grown, there naturally occurs a limit to the production using Dash Necking method in which a diameter of a neck portion is lessened to 5 mm or less, otherwise slip dislocations can not be eliminated.

Therefore, recently a method of growing a silicon single crystal free from dislocation without using Dash Necking method is also being studied. For example, in Japanese Patent Application Laid-Open (kokai) No. 10-203898, a technique in which a silicon single crystal is grown without forming a neck portion by using a seed crystal having a tip end with a sharp-pointed shape or a truncation thereof is disclosed.

If the technique disclosed in the Japanese Patent Application Laid-Open (kokai) No. 10-203898 is used, a silicon single crystal free from dislocation can be grown without lessening a diameter of the crystal to be grown at the tip end of the seed crystal to 5 mm or less. Therefore, it has an advantage in growing a crystal having a large diameter or a heavy crystal.

However, in the technique of manufacturing a silicon single crystal described in the aforementioned Japanese Patent Application Laid-Open (kokai) No. 10-203898, there is a problem of how to adjust operation conditions so as not to generate slip dislocations when the seed crystal is brought into contact with a silicon melt. Even if a seed crystal having a tip end with a sharp-pointed shape or a truncation thereof is used, in the case where a difference of temperatures between the seed crystal and the silicon melt when the seed crystal comes into contact with the silicon melt is larger than required, innumerable slip dislocations are introduced into the seed crystal and it is impossible to eliminate the slip dislocations without necking. Moreover, many points to be studied in terms of operation has remained, for example, slip dislocations are introduced into the seed crystal if the temperature of a silicon melt largely changes even while the tip end of the seed crystal is dipped into the silicon melt to the desired diameter and so on.

As for the silicon wafer, a silicon wafer having a plane orientation of (100) or (111) in a main surface on which a semiconductor device is to be formed has been mainly utilized in view of physical characteristics and advantages in the processes of growing a crystal and fabricating a semiconductor device. However, since transport of carriers when forming a semiconductor device considerably depends on a crystal orientation, in recent years, with the aim of enhancing the working speed of the semiconductor device, a silicon wafer having a plane orientation of (110) in which high switching speed is expected starts to attract attention (Nikkei Microdevices, the February 2001, No. 188, Nikkei BP Inc., published on Feb. 1, 2001).

In order to obtain the silicon wafer having a plane orientation of (110), it is possible to utilize a method in which a silicon single crystal having a crystal orientation of <100> or <111> is processed so that a (110) plane may be a main surface of a wafer, or a method in which a silicon single crystal having a crystal orientation of <110> is grown from the first and processed into a silicon wafer. However, the former method in which a silicon wafer having a plane orientation of (110) in a main surface thereof is manufactured from a single crystal having a crystal orientation of <100> or <111> requires oblique cutting of the cylindrical crystal so that the main surface may be a (110) plane. Therefore, it is not an efficient method for industrial mass production of silicon wafers because, in order to obtain an approximately circular silicon wafer to be a substrate for a standard semiconductor device, stock removal for making its shape becomes great loss and time for processing is long.

To the contrary, in the method in which a single crystal having a crystal orientation of <110> is grown from the first and a silicon wafer with a main surface of a (110) plane is manufactured therefrom, if the silicon single crystal is sliced perpendicularly to the direction of the pulling axis as in the case of manufacturing silicon wafers having other plane orientations, and mirror-polishing is performed, a silicon wafer having a main surface of a (110) plane can be obtained. According to this method, since processing after pulling a single crystal can be performed as in the case of a wafer having a plane orientation of (100) or (111), grinding loss generated when making a shape of a wafer and processing time for making the shape can be minimized. Therefore effective wafer processing without loss can be performed.

However, this method has a problem in growing a silicon single crystal having a crystal orientation of <110>.

Namely, in the case of a crystal having a crystal orientation of <100> or <111>, since slip dislocations caused in a seed crystal by thermal shock are introduced at an angle of about 50–70° to a crystal growth interface, the slip dislocations can be taken out (eliminated) from a crystal to be grown by decreasing a diameter of the crystal to about 3–5 mm. However, in the case of a crystal having a crystal orientation of <110>, because slip dislocations are introduced in the direction approximately perpendicular to a crystal growth interface, it is difficult to eliminate the slip dislocations easily from the crystal to be grown. Consequently, there is a need to grow a silicon single crystal using a method in which a diameter of a neck portion is extremely lessened to less than 2 mm as described in Japanese Patent Application Laid-open (kokai) No. 9-165298 etc., or a special method in which, for example, slip dislocations are taken out by forming multi-step concavity and convexity at a neck portion through repeated operation of lessening a diameter of a neck portion to about 3–5 mm and then enlarging the diameter.

Particularly in the case of growing a silicon single crystal having a crystal orientation of <100> or <111>, if a few slip dislocations are generated at a tip end of a seed crystal by thermal shock, the slip dislocations can be eliminated by virtue of using a seed crystal having a tip end with a sharp-pointed shape or a truncation thereof while the seed crystal is dipped to the desired diameter. However, in the case of a crystal having a crystal orientation of <110>, because slip dislocations are introduced in the direction approximately perpendicular to a melting surface of a seed crystal as described above, it is extremely difficult to eliminate even a few slip dislocations once introduced into the seed crystal.

Thus, in order to grow a silicon single crystal having a crystal orientation of <110> by use of a seed crystal having a tip end with a sharp-pointed shape or a truncation thereof without using Dash Necking method, there is a need to form further adequate operation conditions than the case of growing a silicon single crystal having a crystal orientation of <100> or <111>.

Moreover, also in the case of growing a silicon single crystal having a crystal orientation of <110>, for production of a heavy silicon single crystal with a large diameter, if a neck portion is formed by Dash Necking method to eliminate slip dislocations and further the minimum diameter of the neck portion is lessened to about 2–3 mm to ensure elimination of dislocations, it is hardly possible to pull a silicon single crystal with a large diameter of 200 mm or more and weight of 100 kg or more. In order to support such a heavy silicon single crystal with a large diameter and pull it, there is a need that a diameter of a crystal formed at a tip end of a seed crystal is kept to 5 mm or more even at a portion with minimum diameter.

DISCLOSURE OF THE INVENTION

An object of the present invention is to provide a method of manufacturing a silicon single crystal, in which a success ratio of growing a single crystal free from dislocation is increased when growing the silicon single crystal using a seed crystal having a tip end with a sharp-pointed shape or a truncation thereof by CZ method without Dash necking method, and at the same time, even in the case of growth of a silicon single crystal having a crystal orientation of <110>, a silicon single crystal with a large diameter can be grown by setting a minimum diameter of the crystal formed at a tip end of the seed crystal to 5 mm or more so that a diameter of a constant diameter portion of the single crystal may be 200 mm or more, a silicon single crystal, and a silicon wafer having a large diameter of 200 mm or more with a plane orientation of (110).

In order to accomplish the above object, a method of manufacturing a silicon single crystal of the present invention is a method of manufacturing a silicon single crystal by Czochralski method without performing Dash Necking method, comprising the steps of: providing a seed crystal having a tip end with a sharp-pointed shape or a truncation thereof in which an angle of the tip end is 28° or less; keeping the tip end of the seed crystal just above a silicon melt to heat it before bringing the tip end of the seed crystal into contact with the silicon melt; subsequently bringing the tip end of the seed crystal into contact with the silicon melt and immersing the seed crystal into the silicon melt to a desired diameter; and then shifting to pull the single crystal, wherein a temperature variation at a surface of the silicon melt is kept at ±5° C. or less at least for a period from a point of bringing the tip end of the seed crystal into contact with the silicon melt to a point of shifting to pull the single crystal.

Since Dash Necking is not performed, a diameter of the crystal formed at the tip end of the seed crystal can be kept to 5 mm or more. Therefore, a silicon single crystal having a large diameter of 200 mm or more and weight of 100 kg or more can be pulled.

Particularly in the case of growing a silicon single crystal free from dislocation using a seed crystal having a tip end with a sharp-pointed shape or a truncation thereof without performing Dash Necking (in which a diameter of a crystal formed at a tip end of a seed crystal is once lessened to about 3–5 mm to eliminate slip dislocations), it is desirable that the crystal is grown by use of a seed crystal having a tip end with a sharp-pointed shape or a truncation thereof in which an angle of the tip end is 28° or less. The success ratio of growing a single crystal free from dislocation can be increased by using the seed crystal of which an angle of the tip end is 28° or less.

If the angle of the tip end is 28° or less, it is easy to moderate thermal shock generated when the seed crystal is brought into contact with the silicon melt. Further, even in the case of generating a few slip dislocations, it is easy to let slip dislocations out of the seed crystal if the angle of the tip end is 28° or less. However, in the case of the angle of the tip end of more than 28°, heat capacity at the tip end portion of the seed crystal increases, and temperature difference when bringing the tip end into contact with the silicon melt generates thermal shock. Thereby slip dislocations are introduced into the crystal. Moreover, since a diameter of the tip end of the seed crystal after dipping into the silicon melt becomes large by itself, it becomes difficult to let the introduced slip dislocations out of the crystal.

For these reasons, in the manufacturing method of the present invention, the seed crystal having a tip end with a sharp-pointed shape or a truncation thereof in which an angle of the tip end is 28° or less is utilized to suppress thermal shock when bringing the seed crystal into contact with the silicon melt.

It is necessary to heat the seed crystal just above the silicon melt so as to be approximately the same temperature as a surface of the silicon melt before bringing the above-mentioned seed crystal into contact with the silicon melt.

By heating the seed crystal before bringing it into contact with the silicon melt to set a temperature of the tip end of the seed crystal sufficiently close to a temperature of the silicon melt, the temperature difference between the tip end of the seed crystal dipped into the silicon melt and the silicon melt is made little, and thereby generation of thermal shock can be suppressed. At this time, heating of the seed crystal just above the silicon melt is performed preferably for about 5–60 min, optimally for about 20–30 min.

If the tip end of the seed crystal is heated for a range of 5–60 min, the temperature of the tip end of the seed crystal can be set efficiently close to the temperature of the silicon melt surface, and further productivity of the silicon single crystal is not decreased by the heating. More optimally, an interval between the silicon melt and the tip end of the seed crystal is kept in a range of about 1–5 mm and the seed crystal is heated for 20–30 min, and then it is dipped into the silicon melt. Thereby, the thermal shock when bringing the seed crystal into contact with the silicon melt can be suppressed as small as possible.

Moreover, there is a need to perform dipping while a temperature variation at a surface of the silicon melt near the seed crystal is kept at ±5° C. or less for a period from bringing the tip end of the seed crystal into contact with the silicon melt and immersing it into the silicon melt up to a desired diameter to shifting to pulling the single crystal.

Since the silicon melt is kept as a melt by heating with a heater disposed around it, the silicon melt always generates thermal convection and temperature thereof constantly varies a little. When the temperature variation by the thermal convection is too large, even if the seed crystal is heated in conformity to the temperature of the silicon melt and then is brought into contact with the melt, thermal shock is generated at the tip end of the seed crystal. Thereby slip dislocations are introduced into the seed crystal. In addition, when the tip end of the seed crystal is dipped into the silicon melt, if a temperature of the silicon melt near the seed crystal changes large during dipping of the tip end, thermal strain is generated in the seed crystal through temperature difference between the seed crystal and the melt. Thereby slip dislocations are introduced into the seed crystal, and it becomes difficult to grow a single crystal free from dislocation thereafter.

In order to suppress such introduction of slip dislocations as much as possible, there is a need to pull the single crystal while the temperature variation at the surface of the silicon melt near the tip end of the seed crystal is kept at ±5° C. or less from a temperature when bringing the seed crystal into contact for a period from a point of bringing the tip end of the seed crystal having a sharp-pointed shape or a truncation thereof into contact with the silicon melt to a point of immersing the tip end into the silicon melt to a desired diameter and shifting to pulling. If the temperature variation of the silicon melt is over ±5° C., it becomes easier to introduce slip dislocations into the seed crystal at the time of contact with the melt or dipping, and therefore the success ratio of pulling a silicon single crystal free from dislocation is decreased.

In particular, in a silicon single crystal having a crystal orientation of <110>, from which it is difficult to eliminate slip dislocations once introduced thereinto, if the temperature variation of the silicon melt is over ±5° C., possibility of growing a silicon single crystal free from dislocation extremely decreases. In order to at least pull a silicon single crystal having a crystal orientation of <110> by use of a seed crystal having a tip end with a sharp-pointed shape or a truncation thereof without performing Dash Necking, there is a need to dip the seed crystal to the desired diameter while a temperature variation of the silicon melt near a portion where the tip end of the seed crystal is dipped is kept at ±5° C. or less as compared to the temperature of the melt when bringing the seed crystal into contact with the melt.

More preferably, the temperature variation of the silicon melt is suppressed to ±3° C. or less. If the pulling is performed while the temperature variation of the melt near the dipped portion of the seed crystal is further decreased so that it is kept at ±3° C. or less as compared to the temperature of the melt when bringing the seed crystal into contact with the melt, slip dislocation due to the temperature variation of the silicon melt is hardly generated even in the case of a single crystal having a crystal orientation of <110>. Therefore, a silicon single crystal having no dislocation and the desired diameter can be almost surely pulled.

It is preferable that the seed crystal is brought into contact with the silicon melt and immersed therein with setting a temperature of the silicon melt when bringing the tip end of the seed crystal into contact with the silicon melt to 10–20° C. higher than a temperature appropriate for bringing the seed crystal into contact with the silicon melt in a method of manufacturing a silicon single crystal using Dash Necking method, and the single crystal is pulled with setting a pulling rate to 0.5 mm/min or less at least when forming a decreasing diameter portion for a period from a point immediately after stopping lowering of the seed crystal and shifting to pulling to a point of starting enlargement of a diameter of the crystal formed below the seed crystal.

In a method of manufacturing a silicon single crystal using Dash Necking method, in the case that the temperature of the silicon melt is lower than a temperature appropriate to contact of the seed crystal with the silicon melt, or in the case that even though higher, the difference is less than 10° C., when the seed crystal is dipped into the silicon melt, the dipped portion can not be smoothly melt into the silicon melt. As a result, there is a possibility of bringing about anomalous crystal growth such as occurrence of solidification.

To the contrary, if the temperature of the silicon melt is over 20° C. higher than a temperature appropriate to contact of the seed crystal with the silicon melt in a method of manufacturing a silicon single crystal using Dash Necking method, the tip end is melted before the seed crystal is brought into contact with the silicon melt. As a result, there is a possibility to be unable to successfully bring the seed crystal into contact with the silicon melt.

Considering the above, the seed crystal should be brought into contact with the silicon melt and immersed therein while the temperature of the silicon melt when dipping the seed crystal is kept in a range of 10–20° C. higher than the temperature appropriate to contact of the seed crystal with the silicon melt in a method of manufacturing a silicon single crystal using Dash Necking method.

Then, in formation of a decreasing diameter portion for a period from a point immediately after finishing immersing of the tip end of the seed crystal into the silicon melt to the desired diameter and stopping lowering of the seed crystal to shift to pulling to a point of starting enlargement of a diameter of the crystal formed below the seed crystal, it is desirable that the silicon single crystal is grown while keeping a pulling rate at 0.5 mm/min or less.

At a point immediately after finishing immersing the tip end of the seed crystal to the desired diameter and shifting to pulling, a diameter of a crystal formed below the seed crystal once becomes a little smaller than a diameter at a point of finishing immersing of the seed crystal, and then growth of the crystal is performed (formation of a decreasing diameter portion). At this time, if pulling is performed at a higher rate than required, the diameter of the crystal grown below the seed crystal becomes much smaller than a desired diameter, and as the case may be, disadvantage such as separation of the crystal from the silicon melt occurs.

In order to solve such problems, when forming a decreasing diameter portion for a period from a point after stopping immersing of a seed crystal and shifting to pulling to a point of starting enlargement of a diameter of a crystal formed below the seed crystal, it is adequate to perform growth of a crystal while keeping a pulling rate at 0.5 mm/min or less.

In order to make it easy to set the above-mentioned conditions of contacting with the melt and dipping of the seed crystal, it is preferable that the silicon single crystal is grown while a horizontal magnetic field with the magnetic field intensity of 1000 G or more at a center thereof is applied to the silicon melt at least for a period from a point of bringing the tip end of the seed crystal into contact with the silicon melt to a point of completing formation of the decreasing diameter portion formed below the seed crystal and starting enlargement of the diameter of the crystal.

In the present invention, it is important to perform growth while the temperature variation of the silicon melt near the portion where the tip end of the seed crystal is dipped is kept at ±5° C. or less as compared to the temperature of the melt when bringing the seed crystal into contact with the melt. In order to suppress such a temperature variation of the silicon melt contained in a crucible, it is necessary to suppress thermal convection of the silicon melt generated by heating with heater disposed around the crucible as little as possible. In order to efficiently suppress the thermal convection, Magnetic field applied CZ method (hereinafter, referred to as MCZ method) in which a single crystal is grown with applying a magnetic field to a silicon melt is suitable for use. Particularly, in order to stabilize a temperature of the silicon melt near the seed crystal when bringing the seed crystal into contact with the melt and dipping it thereinto, it is desirable that the seed crystal is brought into contact with the melt and dipped thereinto while applying to the silicon melt a horizontal magnetic field which has a great effect on decreasing temperature gradient of the silicon melt in the crucible. Such methods of growing a silicon single crystal include Horizontal magnetic field applied CZ method (hereinafter, referred to as HMCZ method).

If the tip end of the seed crystal is brought into contact with the silicon melt and dipped into the melt to the desired diameter while applying to the silicon melt a magnetic field with intensity of 1000 G (Gauss) or more by means of this HMCZ method, it becomes easy to suppress the temperature variation of the silicon melt near the dipped portion to ±5° C. or less in the meantime. However, without limiting to such a controlling method, even in the case of a magnetic field with intensity of less than 1000 G or the case of no magnetic field applied, thermal convection can be suppressed by other controlling methods, for example, by heating a surface of the silicon melt through lamp heating to decrease the temperature gradient in the vertical direction inside the silicon melt. Thermal convection of the silicon melt can be also suppressed by setting the amount of the silicon melt less and making a depth of the melt shallow. Further, if growth is performed while suppressing the temperature variation of the silicon melt at a portion where dipping the seed crystal to ±5° C. or less by combination with application of a magnetic field or the like, similar effect can be obtained.

In the case of appropriately suppressing the temperature variation of the silicon melt through application of a magnetic field to the silicon melt, it is preferable that a horizontal magnetic field of which intensity at the center is 1000 G or more is applied to the silicon melt, and a seed crystal having a tip end with a sharp-pointed shape or a truncation thereof is brought into contact with the melt and dipped thereinto.

As for the maximum intensity of the magnetic field applied to the silicon melt, taking a configuration of an apparatus or application of a magnetic field in a practical range into consideration, the upper limit of the magnetic field intensity at the center is at most about 9000–10000 G as it stands in the case of HMCZ method.

A method of pulling a silicon single crystal while applying a horizontal magnetic field of 1000 G or more to a silicon melt using the HMCZ method is also effective in the case of growing a large silicon single crystal having a diameter over 200 mm. In the case of growing a single crystal with a large diameter, taking productivity or yield into consideration, generally a single crystal is grown by using a large crucible for containing a silicon melt and charging a large amount of raw material over 100 kg into the crucible at a time.

When the amount of the raw material contained in the crucible, i.e., the silicon melt, is large, temperature difference between a peripheral portion of the silicon melt near heater and a portion near the center of the melt becomes large. Thereby, it becomes difficult to stabilize the temperature of the melt near a dipped portion of a seed crystal since thermal convection becomes active. At this time, if a desired magnetic field of 1000 G or more is applied to the silicon melt, the temperature of the melt near the dipped portion of the seed crystal can be stabilized since thermal convection in the crucible can be suppressed.

Intensity of the horizontal magnetic field applied to the silicon melt may be appropriately selected in accordance with a diameter and quality conditions of a single crystal to be grown in addition to stability of a temperature of the silicon melt.

If such a method of manufacturing a silicon single crystal is utilized, the temperature of the melt when bringing the seed crystal having a tip end with sharp-pointed shape or a truncation thereof into contact with the silicon melt and dipping it thereinto is stabilized. Therefore, the seed crystal can be dipped to the desired diameter so as to decrease generation of slip dislocations due to thermal shock as much as possible or to generate no slip dislocation.

Thereby, the success ratio of pulling a silicon single crystal having a desired constant diameter portion free from dislocation can be increased, and at the same time a silicon single crystal having a crystal orientation of <110> can be pulled by use of a seed crystal having a crystal orientation of <110>, which has been considered difficult in growth of a silicon single crystal using CZ method due to restriction by Dash Necking method. Also, it becomes possible to pull a silicon single crystal grown by Czochralski method which has a crystal orientation of <110> and a constant diameter portion with a diameter of 200 mm or more, or such a silicon single crystal wherein total weight of the crystal pulled from a silicon melt is 100 kg or more, further over 300 kg.

If the silicon single crystal having a crystal orientation of <110> grown by the aforementioned manufacturing method is subjected to cylindrical grinding, slicing and mirror-polishing using the same manufacturing process as in the case of a crystal having a crystal orientation of <100> or <111>, a silicon wafer having a plane orientation of (110) in a main surface thereof, which is a main raw material when manufacturing a semiconductor device, can be industrially manufactured with high efficiency.

In particular, since it becomes possible to obtain a silicon single crystal having a diameter of more than 200 mm in a constant diameter portion and a crystal orientation of <110>, which has been considered difficult to be grown in a conventional method, a silicon wafer having a main diameter of 200 mm or more and a plane orientation of (110) in a main surface can be easily produced. Here the main diameter of the silicon wafer refers to a diameter of a main surface of the wafer not including an orientation flat or an orientation notch.

If the silicon wafer has a plane orientation of (110) and a diameter of 200 mm or more, a semiconductor device having advanced function can be manufactured with good yield and in large quantities.

In growth of a silicon single crystal having a crystal axis orientation of <110>, since slip dislocations due to thermal shock when a seed crystal comes into contact with a silicon melt are introduced in the direction approximately perpendicular to a crystal growth interface, it is difficult to eliminate the slip dislocations in a method using Dash Necking method, and therefore, mass production has been difficult. Furthermore, in growth of a silicon single crystal having a crystal orientation of <110> using Dash Necking method, since a diameter of a neck portion needs to be lessened to 2 mm or less in order to eliminate slip dislocations, it has been considered difficult to efficiently manufacture a heavy crystal with a large diameter of 200 mm or more, or 300 mm or more.

However, in accordance with the manufacturing method of the present invention, it becomes possible to safely and efficiently produce even a silicon single crystal with a crystal orientation of <110> having a large diameter of more than 200 mm, or a silicon single crystal with a crystal orientation of <110> of which the constant diameter portion was pulled as long as possible and which has a weight of 100 kg or more.

At the same time, in growth of a silicon single crystal having a crystal orientation other than <110> by adopting a Dislocation-free seeding method in which a silicon single crystal is grown without using Dash Necking method, an effect of increasing the success ratio of pulling a single crystal free from dislocation can be obtained.

BEST MODE FOR CARRYING OUT THE INVENTION

Figure 1:
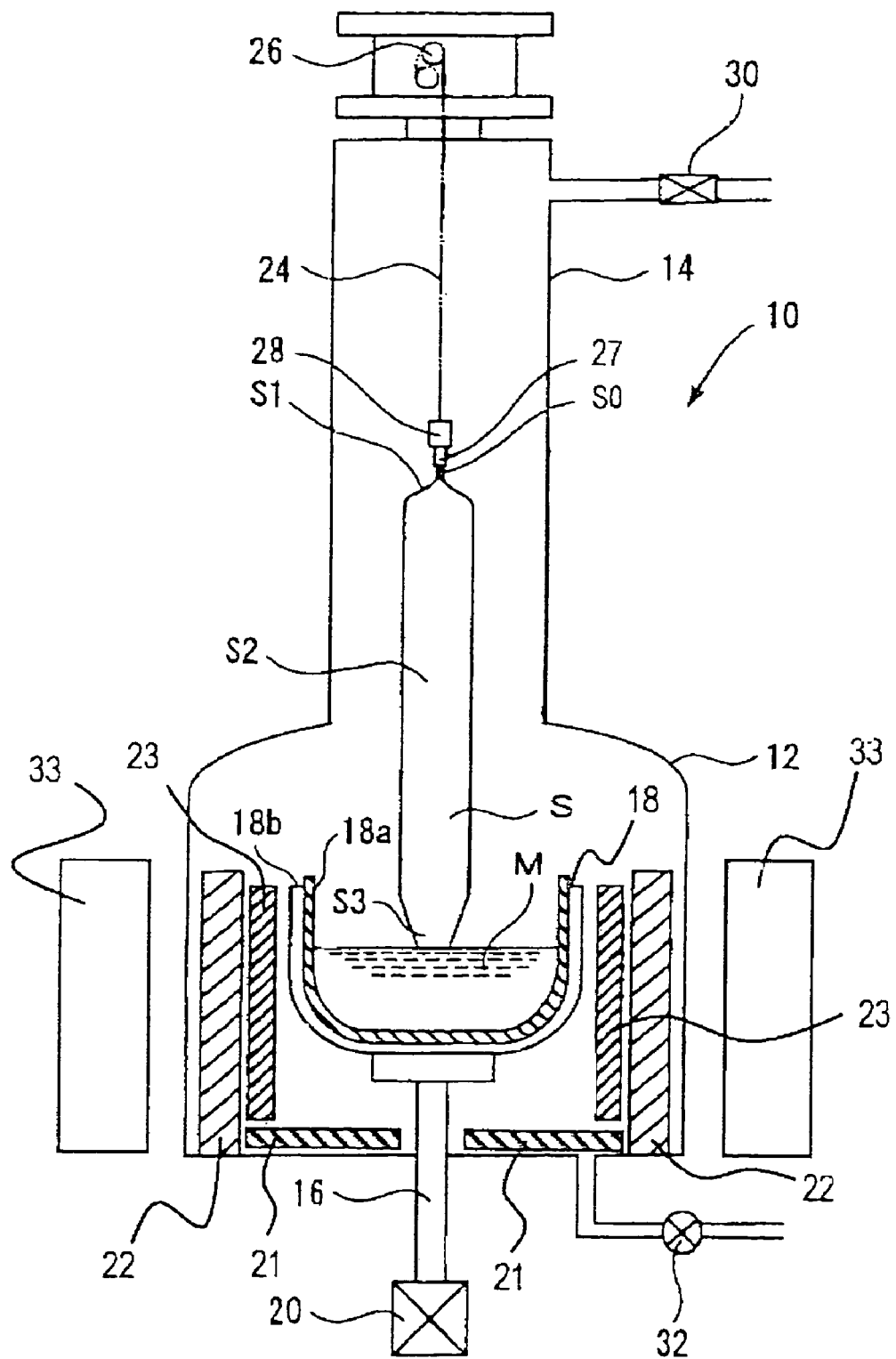
FIG. 1 is a schematic view of an apparatus for manufacturing a single crystal by CZ method, in which a magnetic field applied apparatus is installed, for conducting a method of manufacturing a silicon single crystal according to the present invention.

Hereinafter embodiments of the present invention will be explained with reference to appended drawings. Drawings shown in FIGS. 2(C), 2(D), 2(E) and 2(F) are schematic views showing each seed crystal having a tip end with a sharp-pointed shape or a truncation thereof used in growth of silicon single crystals according to the present invention.

In FIGS. 2(C) and 2(D), FIG. 2(C) shows a seed crystal 1c having a cylindrical straight body 3c with a conical tip end 4c, and FIG. 2(D) shows a seed crystal 1d having a prismatic straight body 3d with a pyramidal tip end 4d.

Each of FIGS. 2(E) and 2(F) shows a tip end of a seed crystal having a shape in which the tip end 4c of the seed crystal shown in FIG. 2(C) is truncated. FIG. 2(E) shows a tip end 4e in which the tip end 4c of the seed crystal 1c is horizontally truncated, and FIG. 2(F) shows a tip end 4f in which the tip end 4c is obliquely truncated. As to seed crystals having shapes of truncated tip end, if the areas of the bottom parts of the tip ends 4e and 4f shown in FIGS. 2(E) and 2(F) respectively are too large, thermal shock is likely to occur when the seed crystals come into contact with a melt. Therefore it is preferable that the area of a seed crystal which first comes into contact with silicon melt is 5 mm$^2$ or less.

In the present invention, in the case of a seed crystal having a truncated shape of the tip end 4c as shown in FIGS. 2(E) and 2(F), an angle of the tip end of the seed crystal refers to an apical angle of the tip end of the seed crystal when assuming a shape of the tip end before the tip end 4c is truncated.

These seed crystals are used in manufacturing a single crystal so that each of the straight bodies 3c and 3d of the seed crystals may be locked in a seed holder 28 of an apparatus 10 for manufacturing a single crystal shown in FIG. 1 via a locking part 2c or 2d provided on the straight body 3c or 3d, respectively.

In the method of manufacturing a silicon single crystal according to the present invention, as shown in FIGS. 2(C), 2(D), 2(E) and 2(F), the tip ends 4c–4f of the seed crystals have sharp-pointed shapes or truncations thereof so that slip dislocations may not be introduced into the seed crystals by thermal shock when the seed crystal comes into contact with a silicon melt, or even if they are introduced, the amount thereof may be a little. They have obviously different shapes from seed crystals used in Dash Necking method.

As examples of seed crystals utilized in growth of a silicon single crystal by means of Dash Necking method, FIG. 2(A) shows an approximately columnar seed crystal and FIG. 2(B) shows a prismatic seed crystal.

When growing a silicon single crystal, in order that a silicon single crystal to be grown may have a desired crystal orientation, the single crystal is grown by use of a seed crystal having the same crystal orientation as the single crystal to be grown. For example, in the case of growing a single crystal having a crystal orientation of <110>, a seed crystal having a crystal orientation of <110> in the direction of a pulling axis can be used.

Figure 2:
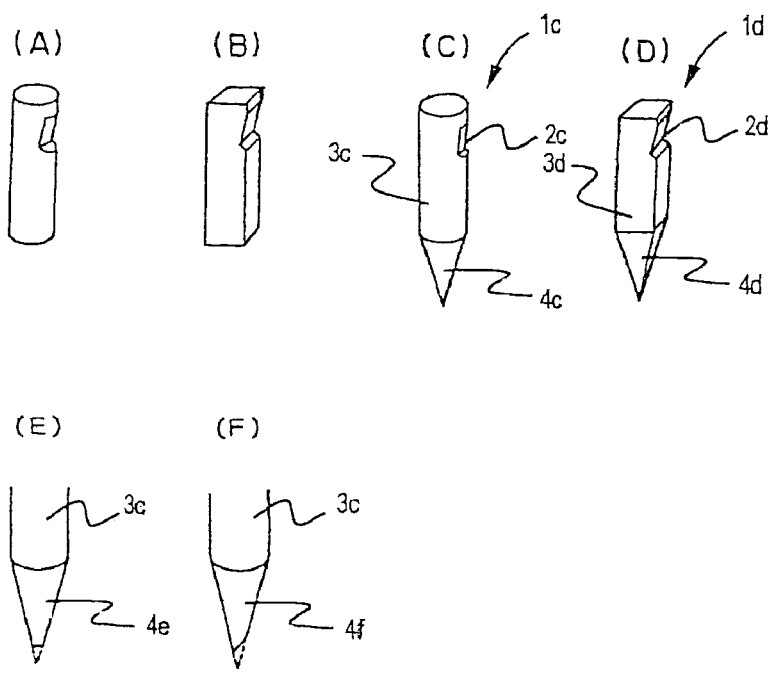
FIG. 2 is a drawing showing seed crystals used in Dash Necking method, and seed crystals, each of which has a tip end with a sharp-pointed shape or a truncation thereof used in the manufacturing method of the present invention.

When a seed crystal whose tip end has a sharp-pointed shape or a truncation thereof is dipped into a silicon melt, the seed crystal 1c or 1d shown in FIG. 2 is heated to approximately the same temperature as the silicon melt M just above the melt. After the temperature of the seed crystal becomes steady, the tip end 4c, 4d or 4e, 4f is gently dipped into the silicon melt M. When the tip end is dipped up to a desired diameter, then pulling is started. Thereby, a silicon single crystal S having an arbitrary decreasing diameter portion S0 shown in FIG. 1 is grown.

FIG. 1 is a schematic view showing an apparatus for manufacturing a silicon single crystal by a method of the present invention. An apparatus 10 for manufacturing a single crystal is composed of a growing furnace 12 where a silicon melt M is kept and growth of a single crystal is conducted, and an upper growing furnace 14 for storing and taking out a silicon single crystal S pulled from the silicon melt M.

At the top of the upper growing furnace 14, a winding and rotating mechanism 26 for rotating and pulling the single crystal when growing the crystal is installed. At the end of a wire 24 wound off from the winding and rotating mechanism 26, a seed holder 28 for locking a seed crystal 27 (the seed crystal 1c or 1d shown in FIG. 2 as an example) is located. When growing a single crystal, a straight body of the seed crystal 27 is locked at the seed holder 28. The wire 24 is wound off from the winding and rotating mechanism 26, and a tip end of the seed crystal is dipped into the silicon melt M up to a desired position, and then the seed crystal 27 is pulled with being rotated at the predetermined rate. Thereby, the silicon single crystal S is grown below the seed crystal 27.

Inside the growing furnace 12, a crucible 18 for containing the silicon melt M is installed. Since it contains the silicon melt M having a high temperature, the inside of the crucible 18 consists of a crucible made of quartz 18a, and the outside thereof consists of a crucible made of graphite 18b for protecting the crucible made of quartz 18a. The crucible 18 is disposed at the approximate center of the growing furnace 12 by a crucible supporting shaft 16. Beneath the crucible supporting shaft 16, a crucible driving mechanism 20 is mounted in order to keep a melt surface constant when growing a single crystal, and in order to grow a crystal with rotating the crucible 18 in CZ method or MCZ method.

Furthermore, a heater made of graphite 23 for melting polycrystalline silicon as a raw material and keeping it as the silicon melt M is disposed outside the crucible 18, and an operation is performed while keeping a temperature of the silicon melt M at a temperature appropriate for growth of a crystal by controlling the amount of heat from the heater 23.

Outside the heater 23 and at the bottom of the growing furnace 12, heat insulators 22 and bottom heat insulators 21 are disposed, which keep the inside of the growing furnace 12 hot, and at the same time prevent a wall of the growing furnace 12 from directly being exposed to radiation heat from the heater 23.

In the apparatus 10 for manufacturing a single crystal shown in FIG. 1, for the purpose of further stabilizing a temperature by controlling convection of the silicon melt M, electromagnet 33, which is an apparatus for applying a horizontal magnetic field to the silicon melt M, is mounted outside the growing furnace 12.

In the apparatus 10 for manufacturing a single crystal, the center of the horizontal magnetic field is positioned inside the silicon melt M to efficiently suppress change in temperature of the melt, and the horizontal magnetic field having intensity of 1000 G or more at the center of the magnetic field, which is a desired magnetic intensity, can be obtained inside the silicon melt M when the seed crystal 27 is dipped.

From the beginning of growth of a single crystal to the time when a temperature of the inside of the furnace becomes a room temperature, it is necessary to perform the operation while flowing inert gas such as argon (Ar) inside the furnace in order to prevent the silicon melt M and structural members disposed inside the apparatus 10 for manufacturing a single crystal from being oxidized and so on. Therefore, a gas flow controlling device 30 for controlling a flow rate of the inert gas flowing inside the manufacturing apparatus 10 is installed in the upper growing furnace 14, and a pressure controlling device 32 for adjusting the internal pressure is installed at the bottom of the growing furnace 12. The flow rate of the inert gas flowing in the apparatus 10 of manufacturing a single crystal and the pressure thereof are adjusted by use of these devices in accordance with growth conditions of a single crystal.

Next, the method of manufacturing a silicon single crystal according to the present invention is explained in detail.

First, polycrystalline silicon as a raw material is charged into the crucible 18, and the polycrystalline silicon is melted by heating from the heater 23. When all of the polycrystalline silicon is melted to be a melt, a temperature of the silicon melt M is decreased to that appropriate for growth of a single crystal. At that time, while adjusting conditions required for bringing the seed crystal 27 into contact with the melt to be dipped, such as introduction of dopant and position adjustment of a surface of the silicon melt M, application of a magnetic field starts so that the horizontal magnetic field with the magnetic field intensity of 1000 G or more at the center may be applied to the silicon melt M by means of the electromagnet 33. This magnetic field is applied at least between the time when the tip end of the seed crystal 27 comes into contact with the silicon melt M and the time when formation of the decreasing diameter portion S0 formed below the seed crystal 27 finishes and the enlargement of a diameter of the crystal starts.

When the temperature of the silicon melt M reaches the predetermined temperature (preferably, a temperature 10–20° C. higher than a temperature appropriate to bring the seed crystal into contact with the silicon melt in the method of manufacturing a silicon single crystal using Dash Necking method), the seed crystal 27 having an apical angle of the tip end of 28° or less is lowered to directly above the silicon melt M after the temperature becomes steady, and then stays until the temperature of the tip end of the seed crystal 27 is heated to approximately the same temperature as the silicon melt M.

Subsequently, when the seed crystal 27 is heated to approximately the same temperature as the silicon melt M, and further a temperature of a surface of the silicon melt M around the center of the crucible 18 into which the seed crystal S is dipped is stabilized to the extent that the temperature is changed in the range of ±5° C. or less, the seed crystal 27 is gently brought into contact with the silicon melt M and dipped thereinto. In order to suppress the introduction of slip dislocations, it is preferable that the temperature variation of the surface at the portion of the silicon melt M where the seed crystal S is dipped is kept in the range of ±5° C. or less, preferably ±3° C. or less, at least until the tip end of the seed crystal 27 is brought into contact with the silicon melt M and then it shifts to pulling.

The descending rate of the seed crystal 27 is decreased to be stopped when the tip end is immersed into the silicon melt M to the predetermined diameter, and then it shifts to pulling while adjusting the ascending rate of the seed crystal 27 and the temperature of the silicon melt.

In shifting to pull the seed crystal 27, if the pulling rate is too fast or the temperature of the melt is not appropriate, occasionally the tip end of the seed crystal 27 detaches from the melt, or a diameter of a crystal formed at the tip end becomes smaller than the desired diameter. When shifting to pull the seed crystal 27, it is gently pulled while observing the diameter of the crystal formed at the tip end of the seed crystal, and adjusting the pulling rate so that the diameter of the crystal to be grown may not become smaller than the desired diameter.

In particular, immediately after shifting to pull the seed crystal 27, the crystal is formed while indicating a tendency that the diameter of the crystal to be grown at the bottom of the seed crystal 27 becomes smaller than the diameter of the tip end after immersion of the tip end of the seed crystal. If the diameter of the crystal is forcedly enlarged at that time, disadvantage may occur, for example, slip dislocations may be introduced into the seed crystal 27, or the growing crystal may be separated from the melt. Therefore, immediately after converting from dipping into pulling, it is necessary to perform pulling with adjusting the pulling rate so that the diameter of the crystal formed at the tip end of the seed crystal 27 may become slightly smaller than the immersion diameter of the tip end portion of the dipped seed crystal 27 (formation of the decreasing diameter portion S0). It is desirably pulled with keeping the pulling rate at this time at 0.5 mm/min or less.

As to the immersion diameter of the tip end of the seed crystal 27, it is necessary to perform dipping with considering that the crystal formed at the tip end when shifting to pulling once becomes thin.

After conforming formation of a crystal having a diameter smaller than the immersion diameter of the tip end at the bottom of the seed crystal 27, the pulling rate and/or the temperature of the melt are gradually changed to lead into an enlarging diameter process in which the diameter of the crystal is enlarged (formation of an enlarging diameter portion S1).

The diameter of the single crystal S formed below the seed crystal 27 through the enlarging diameter process is enlarged to the desired diameter, and the formation of the enlarging diameter portion S1 is stopped when it reaches the predetermined diameter. Then the pulling rate and/or the temperature of the melt are adjusted again to lead into formation of a constant diameter portion S2 of the single crystal. In the formation of the constant diameter portion S2, the constant diameter portion S2 is pulled to be the predetermined length while adjusting operation conditions in conformity to quality of the crystal to be grown and ambience inside the furnace (formation of the constant diameter portion S2).

Then, the growth conditions (a pulling rate, a temperature of a melt, etc.) is changed at the point when the formation of the constant diameter portion S2 having the predetermined length has been completed, and the diameter of the crystal is gradually decreased to form a tail portion S3 (formation of the tail portion S3).

When the formation of the tail portion has been completed, the grown crystal is separate from the silicon melt M, and is wound up to the upper growing furnace 14. The silicon crystal S is taken out from the apparatus 10 for manufacturing a single crystal to its outside after the temperature of the crystal lowers to a room temperature, and thereby growth is finished.

If the single crystal grown in accordance with the above-mentioned method is subjected to cutting/cylindrical grinding process and then it is processed into a wafer having a mirror-surface by the well-known method, a silicon wafer which is a main material for producing a semiconductor device can be obtained.

The present invention will be explained in detail hereinafter with showing examples, but the present invention is not limited thereto.

(Experiment 1)

First, in order to study operation conditions desirable for growing a silicon single crystal having a crystal orientation of <110> which is difficult to produce, a silicon single crystal having a diameter of approximately 150 mm (6 inches) in a constant diameter portion of the crystal was manufactured using an apparatus for manufacturing a silicon single crystal shown in FIG. 1 and adopting a pulling method using Dash Necking method without applying a magnetic field to a silicon melt.

As for a seed crystal, in order to grow a silicon single crystal while eliminating dislocations by Dash Necking method, there was used a seed crystal having a prismatic shape with sides of 15 mm and a crystal orientation of <110> (a seed crystal having a shape shown in FIG. 2(*b*)) in which a surface for contacting with the silicon melt was flat.

A crucible made of quartz and having a bore diameter of 450 mm was installed in an apparatus for manufacturing a silicon single crystal, and 60 kg of polycrystalline silicon as a raw material was filled into the crucible. After gas inside the manufacturing apparatus was exchanged for argon (Ar) gas, a heater made of carbon was heated to make the polycrystalline silicon a silicon melt.

After confirming that all the raw material was melted, dopant was introduced so that a crystal to be grown might be p-type and might have a resistivity of about 10 Ωcm. Then the melt was left until the temperature of the melt became steady, while the temperature of the silicon melt was adjusted so as to lower to the temperature appropriate to growth of a single crystal. In the meantime, operation conditions such as the amount of inert gas (Ar gas) flowing in the manufacturing apparatus, pressure therein and rotation of the crucible were adjusted to the manufacturing conditions for growing a single crystal until the temperature of the melt became steady.

Stability of the temperature of the melt was checked by measuring a surface temperature of the melt at the center of the crucible into which the seed crystal was dipped by use of a radiation thermometer (manufactured by CHINO, IR-02C), through a glass window provided to observe the inside of the manufacturing apparatus from the outside of the apparatus for manufacturing a single crystal. When a temperature appropriate to growth of a silicon crystal seemed to be obtained, the temperature was measured.

A result was shown as "Range of temperature variation of melt" in Table 1. Although the surface temperature of the melt at the center of the crucible was repeatedly measured when the temperature seemed to be steady, the temperatures at the measured point repeatedly changed up and down within a range of ±6° C., and the range of the temperature variation never became smaller.

The measurement of the temperature was stopped at that time. After the seed crystal was heated at just above the silicon melt for about 5 minutes, it was gently brought into contact with the silicon melt and melted, and elimination of slip dislocations was tried using Dash Necking method.

However, it was difficult to eliminate slip dislocations in the seed crystal having a crystal orientation of <110> by Dash Necking method. After elimination of dislocations failed five times, slip dislocations were eliminated when the minimum diameter of a neck portion of the crystal was decreased to 2 mm in the sixth Dash Necking, and thus making dislocation free at the neck portion succeeded.

Although elimination of dislocations at the neck portion by Dash Necking method succeeded, since the temperature variation of the silicon melt might be large, slip dislocations were introduced into the single crystal when the constant diameter portion of the crystal was grown to 60 cm. Consequently it was impossible to pull the crystal without dislocations. (See column "Presence or absence of success in pulling a crystal" in Table 1. O mark indicates a case where a silicon single crystal without dislocations was pulled, and X mark indicates a case where a silicon single crystal without dislocations could not be grown.)

As to results of Experiment 1 and after-mentioned Experiment 2 and Example 1, details are shown in Table 1 for comparison.

TABLE 1

(Results of growing a silicon single crystal having a crystal orientation of <110>)

| | Intensity of applied magnetic field (horizontal magnetic field) | Diameter of grown crystal | Method for necking | The number of failure in seeding | Range of temperature variation of melt | Presence or absence of success in pulling a crystal |
|---|---|---|---|---|---|---|
| Experiment 1 | Not applied | 15 cm | Dash Necking method | 6 times | ±6° C. | X |
| Experiment 2 | Not applied | 20 cm | Dislocation-free seeding method | 9 times | ±8° C. | X |
| Example 1 | 4000 G | 20 cm | Dislocation-free seeding method | 0 time | ±1.5° C. | ○ |

(Experiment 2)

From Experiment 1, it was found that there was a limit to elimination of slip dislocations by Dash Necking method as a method for pulling a heavy crystal with a large diameter since a success ratio was low in the case of a single crystal having a crystal orientation of <110> and in addition, there was a need to thin the minimum diameter of the neck portion up to about 2 mm in order to eliminate dislocations.

A single crystal having a diameter of about 200 mm (8 inches) at a constant diameter portion was practically pulled in order to confirm whether a single crystal having a large diameter could be grown by a method for growing a dislocation-free silicon single crystal using a seed crystal having a sharp-pointed tip end without using Dash Necking method (hereinafter, referred to as dislocation-free seeding method).

Using the same apparatus as Experiment 1 as an apparatus for growing a single crystal, manufacture was conducted without applying a magnetic field to a silicon melt. In Experiment 2, in order to grow a silicon single crystal having a diameter of about 200 mm and a crystal orientation of <110>, a crucible made of quartz and having a bore diameter of 600 mm was installed in the manufacturing apparatus, and 150 kg of polycrystalline silicon as a raw material was charged and became a silicon melt through heating as in Experiment 1.

By the time that the temperature of the silicon melt was stabilized at a temperature appropriate to growth of a single crystal, dopant was introduced into the melt so that resistivity of a p-type crystal might be a value of about 10 Ωcm. Then operation conditions such as Ar gas flow and pressure inside the manufacturing apparatus were adjusted, and it was left until the temperature became steady.

As to a seed crystal used in Experiment 2, since there was a need to perform pulling while avoiding introduction of slip dislocations due to thermal shock without using Dash Necking, a seed crystal having a shape shown in FIG. 2(C), which had a columnar straight body with a diameter of 15 mm and a sharp conical tip end with an apical angle of 15°, was used.

When the temperature of the silicon melt was stabilized at the temperature of 13° C. higher than the temperature at which the seed crystal was brought contact with the silicon melt in Experiment 1, a surface temperature of the silicon melt at the center of the crucible was measured by using the radiation thermometer as in Experiment 1 from the outside of the manufacturing apparatus. As a result, it was repeatedly changed up and down within a range of about ±8° C. as shown in Table 1. However, it was impossible to make the range of temperature variation small any more and to adjust the temperature of the melt to be steady.

In this condition, the seed crystal was gently lowered to 1 mm directly above a surface of the silicon melt and heated for about 20 minutes till the temperature of the seed crystal became approximately the same as the temperature of the melt. Thereafter the seed crystal was brought into contact with the silicon melt and immersed into the melt to the desired diameter, and then the seed crystal was gradually pulled while keeping the pulling rate at 0.5 mm/min or less. Thereby formation of a silicon single crystal below the seed crystal was tried.

However, in most cases, slip dislocations possibly due to thermal shock were introduced into the seed crystal while the tip end of the seed crystal was dipped into the melt to the desired diameter. Although trying to grow crystals using the same dislocation-free seeding method for 9 times while changing the seed crystal in each time, it was impossible to pull a dislocation-free single crystal in all the 9 times.

As the reason thereof, it is considered that since the crucible became larger to increase the amount of silicon melt contained therein, temperature difference of the silicon melt in the crucible was enlarged and the temperature of the melt was destabilized, and therefore slip dislocations were introduced into the seed crystal in process of dipping.

From the result of Experiment 2, it was found that, in order to grow a silicon single crystal while preventing introduction of slip dislocations due to thermal shock by use of a seed crystal with a sharp-pointed tip end and without using Dash Necking method, there was a need to further suppress the temperature variation of the silicon melt when dipping the seed crystal.

(Experiments 3–5)

Influence of a temperature variation of a silicon melt when dipping a seed crystal on slip dislocations in the seed crystal was studied. As a method for controlling the temperature, certain growth conditions as shown in Table 2 regarding Experiments were set, and in Experiment 3 a magnetic field having intensity of 500 G was applied, in Experiment 4 a magnetic field having intensity of 750 G was applied, and in Experiment 5 infrared was irradiated by means of lamp heating to a surface of the silicon melt in order to suppress natural convection due to thermal expansion by decreasing the difference of temperature in the depth direction of the silicon melt and thereby to lower the temperature variation. As to presence or absence of slip dislocations in the seed crystal, the diameter was enlarged to 200 mm after the seed crystal was dipped to the predetermined length and subsequently a decreasing diameter portion was formed, and then judgment on nonexistence of dislocations was conducted by checking crystal habit lines indicating a condition of a single crystal. This is a general method in which crystallization of a single crystal can be easily judged since a characteristic crystal habit to be generated on a surface of a single crystal disappears in the case that dislocations remain in the seed crystal. As a seed crystal, a seed crystal having a shape shown in FIG. 2(c) was used, which had a columnar straight body with a diameter of 15 mm and a sharp conical tip end with an apical angle of 15°.

growth conditions and so forth. In the present invention, it is important to control the temperature variation of the silicon melt, particularly, to control it within ±5° C. Therefore, when it could be controlled in such a condition, methods except for a method of applying a magnetic field were also effective.

EXAMPLE 1

In order to grow the same single crystal having a diameter of about 200 mm and a crystal orientation of <110> as Experiment 2, growth of a silicon single crystal was tried, in which a seed crystal was brought into contact with a silicon melt and dipped therein while applying a horizontal magnetic field to the silicon melt.

The same apparatus as used in Experiment 2 was utilized, and a crucible made of quartz having a bore diameter of 600 mm was installed in the apparatus. 150 kg of polycrystalline silicon was charged therein and the raw material was heated by a heater made of graphite to become a silicon melt.

When all the polycrystalline silicon was melted, the temperature thereof was decreased to the desired temperature suitable for growth of a single crystal. Then dopant was added into the melt so that resistivity of a p-type crystal might be 10 Ωcm, and it was left until the temperature of the melt became steady. In the meanwhile, an apparatus for applying a magnetic field (electromagnet) which was located outside the apparatus for manufacturing a silicon single crystal was operated, and a horizontal magnetic field having intensity of 4000 G at the center of the magnetic field was applied to the silicon melt.

In Example 1, application of the magnetic field was continued from the time when the melting was finished and

TABLE 2

(Results of dislocation generation in a silicon seed crystal having a crystal orientation of <110>)

| | Intensity of applied magnetic field (horizontal magnetic field) | Bore of quartz crucible | The amount of silicon melt | Range of temperature variation of melt | State of dislocation generation |
|---|---|---|---|---|---|
| Experiment 3 | 500 G | 600 mm | 150 kg | ±10° C. | Presence of dislocations |
| Experiment 4 | 750 G | 600 mm | 150 kg | ±5.6° C. | Presence of dislocations |
| Experiment 5 | 0 G | 600 mm | 150 kg | ±4.3° C. | Absence of dislocation |

From Experiment 4 and Experiment 5 in Table 2, it was found that the crystal habit lines on the surface of the crystal disappeared at an enlarging diameter portion and dislocations were generated under the conditions that the range of the temperature variation of the melt exceeded 5° C. Further, from Experiment 5, it could be confirmed that it was possible to grow a single crystal without generating dislocations if the range of the temperature variation of the melt was 5° C. or less.

In the case of controlling the temperature variation of the silicon melt by applying a magnetic field in growth conditions as Experiment 2, if a magnetic field of 1000 G or more was applied, the range could be controlled within ±5° C. It is found that application of a magnetic field with such a level is effective, although the optimal intensity of a magnetic field and so forth are slightly different depending on the stabilization of the temperature of the melt was set out until the time when the growth of the silicon single crystal was finished and a tail portion of the crystal was separated from the melt.

After applying the magnetic field to the silicon melt, a surface temperature of the melt around the center of the crucible was measured by the radiation thermometer as Experiment 2 when the temperature of the melt seemed to be stabilized at approximately the same as the temperature in Experiment 2. The temperature variation was settled within ±1.5° C., and therefore it was confirmed that it was kept in good condition for bringing a seed crystal into contact with the melt.

A seed crystal having the same shape as Experiment 2, which had a diameter of 15 mm in the straight body, a sharp conical tip end with an apical angle of 15°, and a crystal orientation of <110>, was loaded in a seed holder of the manufacturing apparatus.

After confirming stabilization of the temperature of the melt, the seed crystal was gently lowered to 1 mm directly above the silicon melt, and it was left for about 20 minutes until the seed crystal was heated. Then after the seed crystal was heated to the temperature as much as the temperature of the silicon melt, the tip end of the seed crystal was gradually lowered into the melt and the conical portion of the tip end of the seed crystal (the tip end portion) was immersed into the silicon melt up to a desired diameter.

When the seed crystal was immersed to the desired diameter, lowering of the seed crystal was stopped and pulling started gently. When the temperature variation of the surface of the silicon melt between the time of bringing the seed crystal into contact with the silicon melt and the time of shifting to the pulling was measured by means of the radiation thermometer, it was confirmed that the temperature variation was kept within a range of ±1.5° C. Then, a decreasing diameter portion was formed below the seed crystal while keeping the pulling rate of the seed crystal at 0.5 mm/min or less and controlling the temperature of the silicon melt, and after that, the diameter of the crystal was enlarged to the predetermined diameter to grow a silicon crystal having a diameter of about 200 mm in the constant diameter portion.

After growing the constant diameter portion so that the constant diameter portion of the single crystal might have the predetermined length, the diameter of the crystal was gradually lessened to form a tail portion and the grown crystal was separated from the silicon melt. Thereby the growth of the silicon single crystal had been finished.

Figure 3:
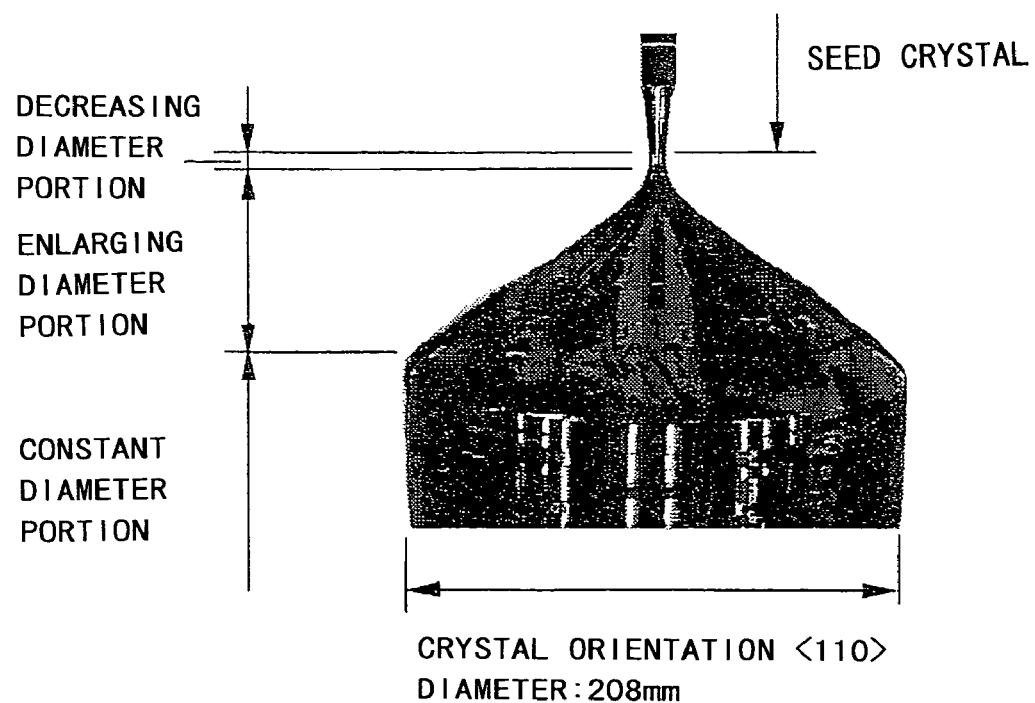
FIG. 3 is a photograph showing a portion of a silicon single crystal having a crystal orientation of <110> and a diameter of about 200 mm grown by means of the manufacturing method of the present invention.
Figure 4:
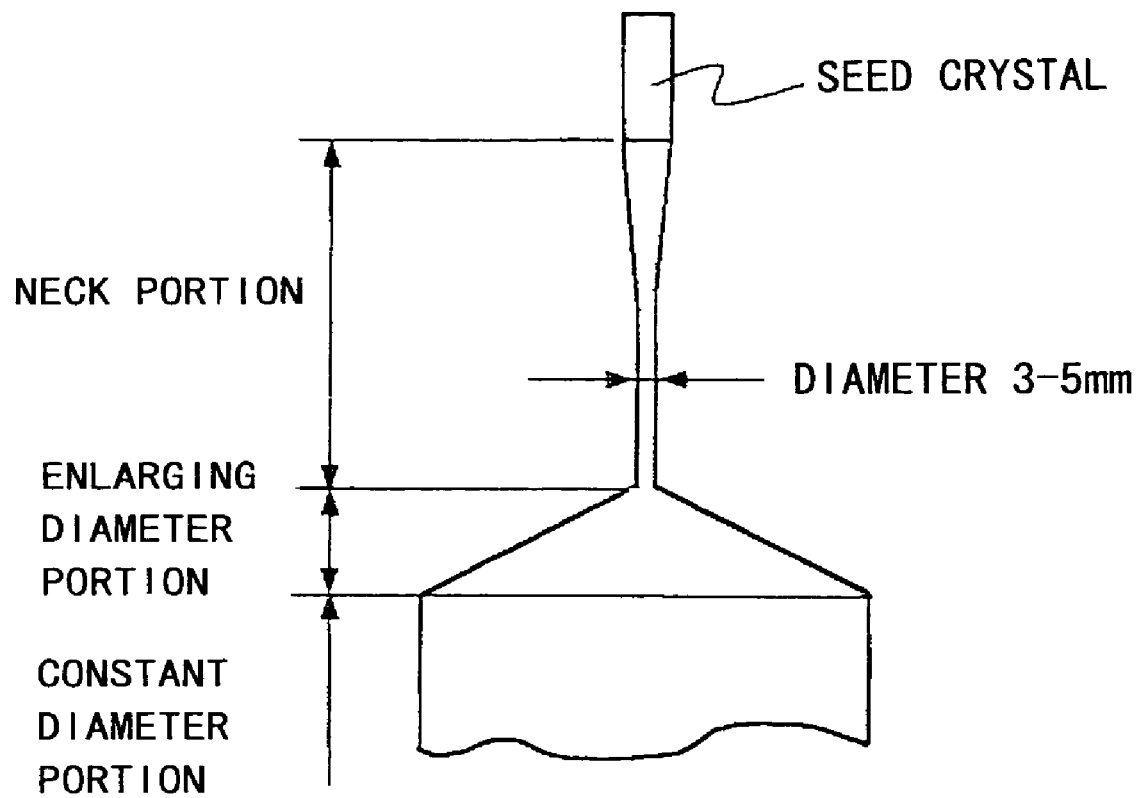
FIG. 4 is a drawing for illustrating removal of slip dislocations by Dash Necking method.

The grown silicon single crystal was gently cooled, and it was taken out of the manufacturing apparatus. When its weight was measured, a heavy single crystal with a large diameter shown in FIG. 3 was obtained, which had a diameter of 208 mm and weight of 120 kg. Further, there was no failure such that a crystal was grown again from the beginning due to introduction of slip dislocations during growth, and therefore it was possible to grow a heavy single crystal with a large diameter which was dislocation-free and had an intended crystal orientation of <110> without any difficulty. Moreover, as a result of the measurement after the pulling, it was confirmed that the minimum diameter of the decreasing diameter portion formed at the tip end of the seed crystal shown in FIG. 3 was 5 mm or more, and therefore a single crystal could be grown without using Dash Necking method.

Thereby, according to the manufacturing method of the present invention, it was found that it was possible to optimally manufacture even a silicon single crystal with a crystal orientation of <110>, which had been thought impossible to be grown as a heavy single crystal with a large diameter, by CZ method including MCZ method.

Further according to the present invention, it was found that, in the case of adopting the dislocation-free seeding method in which a silicon single crystal was grown by using a seed crystal having a tip end with a sharp-pointed shape or a truncation thereof without using Dash Necking method, the ratio of success could be improved.

The present invention is not limited to the embodiments described above. The above-described aspects are mere examples, and those having substantially the same structure as technical ideas described in the appended claims and providing the similar functions and advantages are included in the scope of the present invention.

For example, the embodiments of the present invention were explained with referring to an example of growing a silicon single crystal having a diameter of 200 mm (8 inches), however, the effects of the present invention can be sufficiently obtained also in the case of growing a silicon single crystal having a smaller diameter. Further the present invention is also effective in increasing the weight since there is no need to perform necking of a seed crystal by Dash Necking method. For example, in the present invention, since the diameter of 5 mm or more can be ensured even at the minimum diameter portion of a crystal formed at the tip end of a seed crystal, the present invention can be also applied to manufacture of a silicon single crystal with a large diameter of 300 mm (12 inches) or more which have been widely utilized in recent years, particularly, a heavy silicon single crystal having weight of the crystal over 300 kg.

In the embodiments, examples of a crystal orientation of <110> which is most difficult in pulling were explained, however, the present invention can be also properly applied to pulling of crystals having other crystal orientations. Pulling a crystal having a crystal orientation of <100> or <111> is not difficult compared with pulling a crystal of <110>, but the method according to the present invention is still effective since frequency of failure of seeding decreases.

The invention claimed is:

1. A method of manufacturing a silicon single crystal by Czochralski method without performing Dash Necking method, comprising:
   providing a seed crystal having a tip end with a sharp-pointed shape or a truncation thereof in which an angle of the tip end is 28° or less;
   keeping the tip end of the seed crystal at just above a silicon melt to heat it before bringing the tip end of the seed crystal into contact with the silicon melt;
   subsequently, bringing the tip end of the seed crystal into contact with the silicon melt and immersing the seed crystal into the silicon melt to a desired diameter; and then
   shifting to pull the single crystal,
   wherein a temperature variation at a surface of the silicon melt is kept at ±5° C. or less at least for a period from a point of bringing the tip end of the seed crystal into contact with the silicon melt to a point of shifting to pull the single crystal, wherein the seed crystal is brought into contact with the silicon melt and immersed therein with setting a temperature of the silicon melt when bringing the tip end of the seed crystal into contact with the silicon melt to 10–20° C. higher compared to a temperature used for bringing the seed crystal into contact with the silicon melt in a method of manufacturing a silicon single crystal in Dash Necking method, and wherein the single crystal is pulled with setting a pulling rate to 0.5 mm/min. or less when forming a decreasing diameter portion for a period from a point immediately after stopping lowering of the seed crystal and shifting to pulling to a point of starting enlargement of a diameter of the crystal formed below the seed crystal.

2. The method of manufacturing a silicon single crystal according to claim 1, wherein the single crystal is pulled while a horizontal magnetic field with a magnetic field intensity of 1000 G or more at a center thereof is applied to the silicon melt at least for a period from a point of bringing the tip end of the seed crystal into contact with the silicon melt to a point of completing formation of a decreasing diameter portion formed below the seed crystal and starting enlargement of the diameter of the crystal.

3. The method of manufacturing a silicon single crystal according to claim 1, wherein a silicon single crystal having a crystal orientation of <110> is pulled by using a seed crystal having a crystal orientation of <110>.

4. The method of manufacturing a silicon single crystal according to claim 2, wherein a silicon single crystal having a crystal orientation of <110> is pulled by using a seed crystal having a crystal orientation of <110>.

* * * * *